(12) United States Patent
Oomori et al.

(10) Patent No.: US 7,415,187 B2
(45) Date of Patent: Aug. 19, 2008

(54) SEMICONDUCTOR LASER MODULE AND A METHOD FOR MANUFACTURING THE SAME

(75) Inventors: Hirotaka Oomori, Yokohama (JP); Masaki Migita, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 35 days.

(21) Appl. No.: 11/349,412

(22) Filed: Feb. 6, 2006

(65) Prior Publication Data
US 2006/0198600 A1 Sep. 7, 2006

(30) Foreign Application Priority Data
Feb. 8, 2005 (JP) ............... 2005-031949

(51) Int. Cl.
*G02B 6/00* (2006.01)
(52) U.S. Cl. .......................... 385/147; 385/88
(58) Field of Classification Search ............... None
See application file for complete search history.

(56) References Cited

U.S. PATENT DOCUMENTS 6,506,624 B2 1/2003 Tatoh et al.
2003/0057560 A1* 3/2003 Tatoh et al. ............... 257/773
2003/0189260 A1* 10/2003 Tong et al. ............... 257/778

FOREIGN PATENT DOCUMENTS

| JP | 2002-076501 | 3/2002 |
| JP | 2002-094171 | 3/2002 |
| JP | 2003-158328 | 5/2003 |
| JP | 2004-253779 | 9/2004 |

OTHER PUBLICATIONS

Miki et al., "Extremely Compact DFB Laser Modules for the DWDM and CWDM Systems in the Wide Temperature Range," ECOC 2004, Th. 2.4.4: 866-867.

* cited by examiner

*Primary Examiner*—Sung H Pak
(74) *Attorney, Agent, or Firm*—Fish & Richardson P.C.

(57) ABSTRACT

The present invention is to provide an optical module that installs a laser diode and a Peltier device, and to provide a method for manufacturing the optical module. The invention may relax the restriction of the solder used in the assembly thereof and may prevent the thermoelectric device from degrading the performance and the reliability thereof. The laser module includes a base, the thermoelectric device, and the carrier. The thermoelectric device is fixed to the base with a first solder, while the carrier is fixed to the thermoelectric device with a second solder whose melting point is smaller than the melting point of the first solder. When the first solder is melted to fix the thermoelectric device, the second solder is also melted to fix the carrier on the thermoelectric device.

5 Claims, 3 Drawing Sheets

SEMICONDUCTOR LASER MODULE AND A METHOD FOR MANUFACTURING THE SAME

BACKGROUND OF THE INVENTION

1. Field of the Invention

The present invention relates to a semiconductor laser module and a method for manufacturing the laser module.

2. Related Prior Art

A Peltier device has been used to be installed within the laser module to cool down the laser diode (hereinafter denoted as LD). The Japanese patent published as JP-2002-094171A has disclosed a method for manufacturing an optical module that installs a laser diode and a Peltier device with a small-sized package. The method disclosed in the prior patent applies a soldering to install the laser diode on the Peltier device.

Another Japanese patent published as JP-2003-158328A has disclosed a method for assembling the laser diode on the Peltier device, in which a collet that handles the LD chip provides a heating means to raise the temperature of the solder between the LD chip and the chip carrier for the LD. Still another patent published as JP-2002-076501A and U.S. Pat. No. 6,506,624, have disclosed a method for assembling the Peltier device, in which a bottom of the Peltier device is fixed with a solder, types of which is PbSn, while the upper plate thereof mounts the LD chip with a solder of BiSn. Because the BiSn may be easily oxidized, the process using the BiSn solder is carried out within a hydrogen atmosphere. However, recent electronic equipments are strongly requested that a solder without lead and its compounds, the use of PbSn solder should be avoided. Not only a butterfly package with the box shape but a co-axial package with the cylindrical shape comes to install the Peltier device therein. Japanese patent published as JP-2004-253779A and a conference paper by Atsushi Miki et. al., titled by "Extremely Compact DFB Laser Module for the DWDM and CWDM Systems in the Wide Temperature Range", ECOC 2004, Th. 2. 4. 4, have disclosed such laser module with the co-axial package.

As commented, a trend to use a lead free solder in electronic equipments has recently and globally accelerated. Conventionally, when a LD chip is mounted on the chip carrier with the good heat conductivity, the PbSn solder, whose melting point is about 180° C., can be used. However, the above trend to avoid the lead compound may hesitate to use this solder. Although a first substitution may be SnZn whose melting point is about 200° C., this increase of 20° C. of the melting point causes various subjects to be solved.

The Peltier device generally causes a large temperature difference between the upper and lower plates thereof because the material used is one type of thermal insulator. Rather, a superior Peltier device makes the larger temperature difference between the plates. Due to this temperature difference, a type of solder applicable in the assembly of the laser module is restricted. That is, in a case that the $Au_{0.8}Sn_{0.2}$ with a melting point of about 280° C. is applied for fixing the Peltier device in the lower plate thereof to the base, while the LD is fixed to the LD carrier with a SnZn solder, which does not contain the lead (Pb) and the. melting point is about 200° C., to fix the LD carrier on the upper plate of the Peltier device is restricted to use a solder whose melting point between that of the $Au_{0.8}Sn_{0.2}$ and the SnZn. One typical example for such solder may be $Au_{0.1}Sn_{0.9}$ and SnSb with the melting point of 220° C. and 240° C., respectively.

However, in the case that the SnSb solder (melting point: 240° C.) is used between the upper plate of the Peltier device and the LD carrier, the temperature of the base and the lower plate of the Peltier device is necessary to be raised nearly to the melting point of the $Au_{0.8}Sn_{0.2}$ solder laid therebetween in order to heat up the upper plate of the device to the melting temperature of SnSb, 240° C., to solder the LD carrier on the upper plate of the Peltier device due to the thermally insulating characteristic inherently attributed to the Peltier device. In such case, the softening of the $Au_{0.8}Sn_{0.2}$ solder may occur to cause a misalignment between the Peltier device and the base that affects the optical coupling between the LD and the optical fiber.

Another solder with a lower melting points, such as $Au_{0.1}Sn_{0.9}$ (melting point: 220° C.), is applied may solve the subject above mentioned that the softening of the first solder between the base and the Peltier device. However, this case may not assure a temperature difference between the solder, the SnZn (the melting point: 200° C.), between the LD carrier and the LD chip, so the wettability of the upper surface of the LD carrier, where the LD is to be mounted thereon, may not be secured and degrade the reliability of the assembly.

For the process of heating the collet disclosed in the JP-2003-158328A, although this process may be escaped from the restriction of the solder and increase the variation of the soldering process, the equipment used in the process becomes complicated to enhance the process cost. Moreover, processes disclosed in prior arts listed above are necessary to solder twice, that is, the first soldering between the base and the lower plate of the Peltier device and the second soldering between the upper plate of the device and the LD carrier after the first soldering, and both soldering accompany with the rapid increase and decrease of the temperature which degrades the performance of the Peltier device and the reliability thereof.

The present invention is performed to solve the above subject, that is, even when the SnZn solder as the lead free material is applied for the fixing of the LD to the LD carrier, the invention may relax the restriction of the solder used for fixing the Peltier device to the base and the LD carrier to the Peltier device and may prevent the Peltier device from degrading its performance and reliability by the heat cycle.

SUMMARY OF THE INVENTION

One aspect of the present invention relates to a method for assembling a thermoelectric device such as a Peltier device on a base and a carrier, which mounts a semiconductor laser diode thereon, on the thermoelectric device within a semiconductor laser module. The method according to the invention comprises steps of: (a) disposing a first solder between the base and the thermoelectric device, (b) disposing a second solder, whose melting point is lower than the melting point of the first solder, between the carrier and the thermoelectric device, and (c) melting the first and second solder in the same time with a heater installed beneath the base to mount the thermoelectric device on the base and the carrier on the thermoelectric device. The first solder may be made of AuSn eutectic alloy with a melting point around 280° C., and the second solder may be made of SnSb alloy with a melting point around 240° C.

The semiconductor laser module of the present invention may further include another carrier. The thermoelectric device mounts the carrier thereon with the second solder, while the carrier mounts the other carrier thereon with a third solder whose melting point is lower than the second solder. The third solder may be made of SnZn eutectic allow with a melting point around 200° C. According to the present invention, a solder containing lead (Pb) becomes unnecessary to be used.

DESCRIPTION OF PREFERRED EMBODIMENTS

Next, preferred embodiments of the present invention will be described as referring to accompanying drawings. In drawings and their explanations, the same numerals and symbols will refer to the same elements without overlapping explanations.

Figure 1:
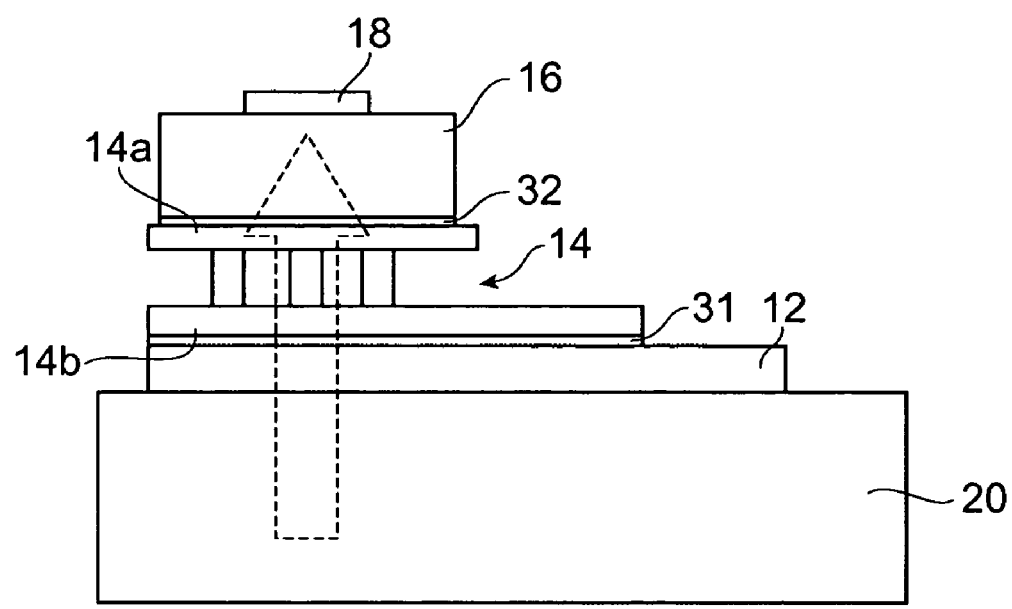
FIG. 1 is a schematic diagram showing a process for assembling the laser module.

FIG. 1 is a schematic diagram showing a process for assembling a laser module. In the laser module that builds a Peltier device therein, the lower plate 14b of the device 14 is firstly fixed to the base 12 of the package, then a LD carrier 16 where the laser diode (LD) 18 is mounted is fixed to the upper plate 14a of the device 14, which is the so-called two-body assembly. Between the base 12 and the Peltier device is provided with a first solder 31, while the between the LD carrier 16 and the Peltier device 14 is provided with a second solder 32. First, the first solder 31 is rapidly solidified after the heating and melting by the heater 20 disposed beneath the base 12, which fixes the Peltier device 14 to the base 12. Next, the second solder 32 is rapidly solidified after heating and melting thereof by the heater 20, which fixes the LD carrier 16 onto the upper plate 14a of the device 14.

As shown in FIG. 1, the fixing of the LD carrier on the upper plate 14a of the device 14 is carried out by heating the lower plate 14b with the heater 20, namely, indirectly heating the second solder 32. However, the thermal conductivity of the Peltier device shows a quite small, typically smaller than 1.5 W/m/K, accordingly, a large temperature difference between the upper 14a and lower 14b plates of the device 14 may occur. To melt the second solder 32 on the upper plate 14a is necessary to heat up the lower plate 14b thereof nearly to the melting temperature of the first solder 31.

Figure 2:
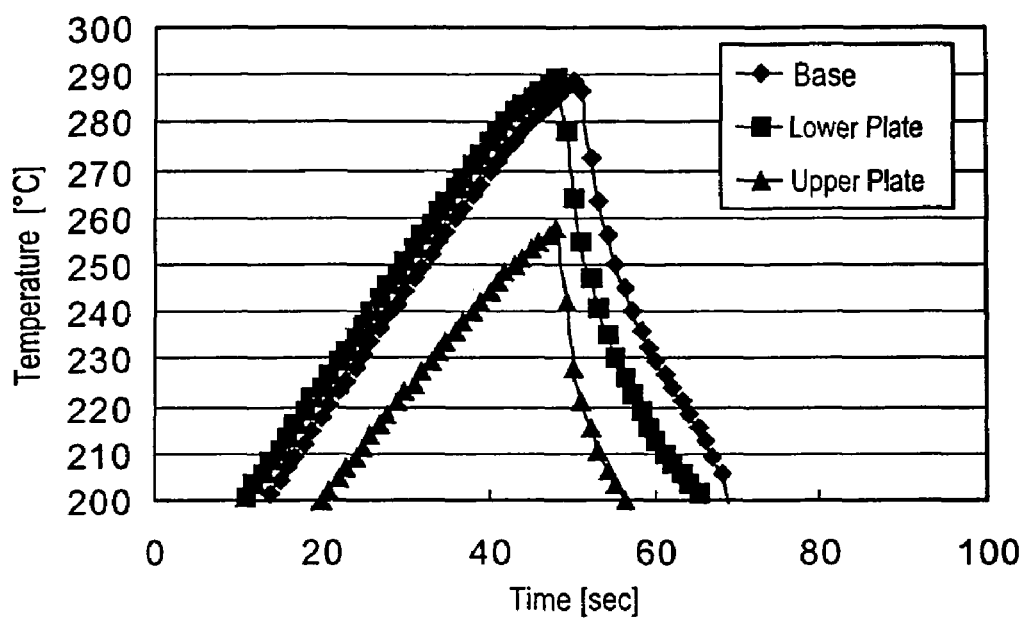
FIG. 2 shows behaviors in the temperature of the upper and lower plate of the Peltier device.

FIG. 2 shows behaviors of temperature of the base 12, the lower 14b and upper 14a plates of the Peltier device when the second solder 32 is melted. The highest temperature of the upper plate 14a becomes higher than that of the lower plate 14b by about 20° C. or more.

Figure 3:
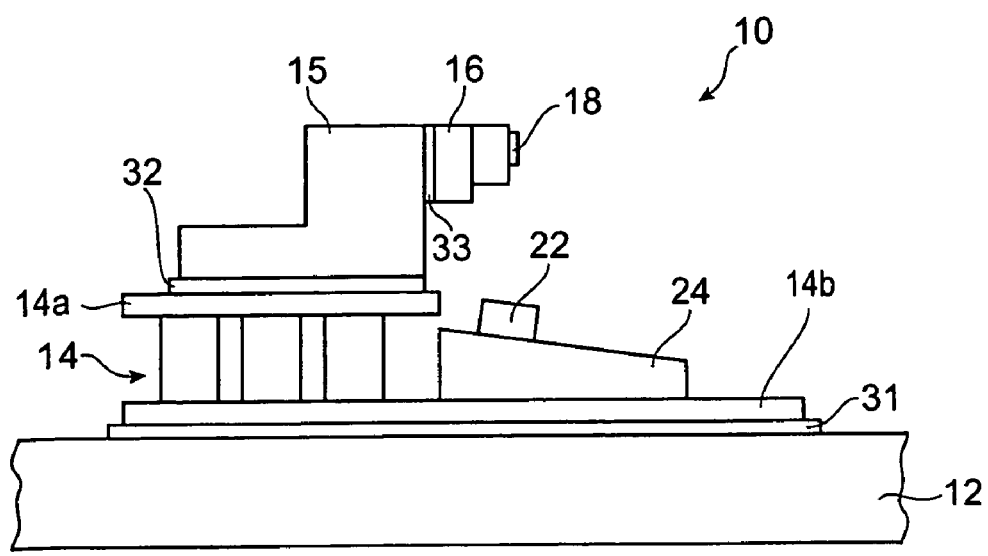
FIG. 3 is a schematic diagram of a laser module with a co-axial package that installs a Peltier device therein.

FIG. 3 is a schematic diagram showing another laser module 10 that builds a Peltier device and has a co-axial package. FIG. 3 omits lead pins and bonding wires to provide the electronic signal to the LD and the Peltier device.

As shown in FIG. 3, the laser module 10 comprises the base 12, the Peltier device 14 mounted on the base 12, an L-shaped carrier 15 disposed on the Peltier device 14, and the LD carrier 16 disposed on a side of the L-shaped carrier 15. The lower plate 14b of the Peltier device 14 is fixed to the base 12 with the first solder 31, the L-shaped carrier 15 is fixed to the upper plate 14a of the Peltier device 14 with the second solder, and the LD carrier 16 is fixed to the L-shaped carrier 15 with the third solder 33. The LD carrier 16 mounts the LD 18 thereon. By providing a current between to electrodes of the Peltier device 14, generally these two electrodes being located within the lower plate 14b, one of upper or lower plate is cooled down, simultaneously, the other plate is heated up. Which plate is heated up or cooled down is determined by the direction of the current. On the lower plate 14b of the Peltier device 14 is mounted with a carrier 24 for a photodiode (PD) 22 to monitor light emitted from the LD 18.

In the laser module 10 shown in FIG. 3, the L-shaped carrier 15 is fixed to the Peltier device 14 after the Peltier device 14 is mounted on the base 12, and then the LD carrier 16 is fixed to the side of the L-shaped carrier 15 with the third solder 33. The outer shape of this laser module 10 may be the so-called co-axial module with the base having a function of the stem that provides a plurality of lead pins, or may be the so-called butterfly module with the base having a function of the bottom of the package and the lead pins extending from the side of the package.

In the laser module shown in FIG. 1 and FIG. 3, when the SnSb solder (the melting point: 239° C.) is used as the second solder 32 to fix the L-shaped carrier 15 to the upper plate 14a of the Peltier device 14, the first solder 31, which is $Au_{0.8}Sn_{0.2}$ (the melting point: 283° C.) eutectic metal, may soften during the melting of the second solder 32 to cause the misalignment of the Peltier device 13 against the base 12. Therefore, anther solder with relative lower melting point such as $Au_{0.1}Sn_{0.9}$ (the melting point: 220° C.) is necessary to apply. Moreover, the configuration shown in FIG. 3 that accompanies with another carrier, the LD carrier 16 on the side of the L-shaped carrier 15, has further restriction for the third solder 33 therebetween.

Thus, it is hard, in the trend to escape from the lead compound from the view point of the environmental protection, to select the solder for the two-body assembly of the electronic equipment. Counting the process margin in the temperature conditions into account, the third solder 33 for the assembly of the LD carrier is necessary to show further low melting point compared to that of the SnAu (the melting point: 220° C.) for fixing the L-shaped carrier 15 to the Peltier device 14.

In the assembly described above, the Peltier device is necessary to be rapidly increased and decreased in the temperature thereof twice, namely, when the lower plate 14b thereof is fixed to the base 12 and the L-shaped carrier 15 is to the upper plate 14a thereof. During these heat cycles, the Peltier device is heated up to around 300° C. and is cooled down to the room temperature within about 60 seconds. As explained previously, since the Peltier device is delicate to the rapid change in the temperature, these two heat cycles may degrade the performance of the Peltier device and the reliability thereof.

As shown in FIG. 2, the temperature difference between the upper and lower plates of the Peltier device 14 reaches from 30 to 40° C. When the temperature of the lower plate 14b is about 280° C., the upper plate 14a becomes about 240° C. Utilizing this temperature difference between two plates, the present invention carries out the three-body assembly in the same time using difference solder. Specifically, the $Au_{0.8}Sn_{0.2}$ solder is provided for the first solder 31 between the base 12 and the Peltier device 14, while the SnSb is provided for the second solder 32 between the L-shaped carrier 15 and the Peltier device 14. Moreover, the three bodies of the base 12, the Peltier device 14, and the L-shaped carrier 15 are heated up in the same time with the heater beneath the base 12, which is not shown in FIG. 3. The first solder 31 of $Au_{0.8}Sn_{0.2}$ is a eutectic metal with the melting point of about 283° C., while the second solder 32 is another alloy containing Sn and Sb with a ratio of 91.5:8.5, the melting point of which is about 238° C. The heater, similar to the heater 20 shown in FIG. 1, is disposed beneath the base 12.

The lower plate 14b of the Peltier device 14 is heated up by the heater to a temperature, under which the AuSn solder may be melted, the upper plate 14a of the Peltier device 14 becomes a temperature, under which the SnSb solder may be melted. Thus, two solders, 31 and 32, may be melted in the same time. After assembling the Peltier device 14 and the L-shaped carrier 15 on the Peltier device 14, two solders, 31 and 32, are rapidly cooled down to the room temperature, which completed the three-body assembly of the base 12, the Peltier device 14, and the L-shaped carrier 15.

According to the present method for assembling the Peltier device and the L-shaped carrier, a solder with a melting point higher than that of the solder used in the conventional two-body assembly, may be applicable. Since a material that melts without melting the first solder 31 is not necessary for the second solder 32, the restriction for selecting the solder may be relaxed. Moreover, the rapid heating up to about 300° C. and the rapid cooling down to the room temperature for the Peltier device 14 is diminished to once in the whole assembling process of the module, the degradation of the performance and the reliability of the Peltier device may be prevented. The present invention does not use a technique to heat up the collet, so the increase of the process cost may be suppressed.

Although specific embodiments have been illustrated and described herein, it will be understood by those of ordinary skill in the art that a wide variety of alternate and/or equivalent implementations and embodiments that achieve the same purposes may be substituted for the specific embodiments shown and described without departing from the scope of the present invention. For example, although the embodiments shown in FIGS. 1 and 3 use the SnZn eutectic solder for fixing the LD chip onto the LD carrier, another material such as conductive resin containing Ag (silver) that has a hardening temperature around or below 200° C. is substitutable for the SnZn eutectic solder. Thus, those with skill in the optical, mechanical, and opto-mechanical arts will readily understand that the present invention may be implemented in a very wide variety of embodiments. This application is intended to cover any adaptations or variations of the embodiments discussed herein.

What is claimed is:

1. A method for manufacturing a semiconductor laser module that assembles a carrier on a thermoelectric device and the thermoelectric device on a base, the carrier mounting a laser diode thereon, the method comprising:
   disposing a first solder with a first melting point between the base and a lower plate of the thermoelectric device;
   disposing a second solder with a second melting point lower than the first melting point between the carrier and an upper plate of the thermoelectric device;
   heating the base, the thermoelectric device and the carrier to melt the first solder and the second solder at the same time by a heater disposed beneath the base to assemble the carrier on the thermoelectric device and to assemble the thermoelectric device on the base; and
   cooling the first and second solders, the thermoelectric device and the carrier on the thermoelectric device to room temperature,
   wherein heating the base, the thermoelectric device and the carrier is performed within 60 seconds from about 200° C. to about 280° C. for the temperature of the base, and wherein the cooling is performed within 20 seconds from about 280° C. to about 200° C. for the temperature of the base.

2. The method according to claim 1, wherein the first solder is AuSn eutectic alloy and the second solder is SnSb alloy.

3. The method according to claim 1, wherein the laser diode is mounted on the carrier with a third solder made of SnZn eutectic alloy.

4. The method according to claim 3, wherein another carrier is disposed between the laser diode and the carrier, the other carrier being fixed to the carrier with the SnZn eutectic alloy.

5. The method according to claim 1, wherein the laser diode, the carrier, and the thermoelectric device are installed within a co-axial module with a cylindrical package.

* * * * *